United States Patent [19]

Ogawa

[11] 4,288,752
[45] Sep. 8, 1981

[54] STEREO DEMODULATOR WITH HIGH FREQUENCY DE-EMPHASIS COMPENSATION

[75] Inventor: Atsushi Ogawa, Tokyo, Japan

[73] Assignee: Trio Kabushiki Kaisha, Tokyo, Japan

[21] Appl. No.: 74,824

[22] Filed: Sep. 12, 1979

[30] Foreign Application Priority Data

Sep. 18, 1978 [JP] Japan ............................ 53-127772[U]

[51] Int. Cl.³ .......................... H03D 3/18; H04H 5/00
[52] U.S. Cl. .................................. 329/50; 179/1 GE; 329/167
[58] Field of Search ......................... 329/50, 122, 167; 179/1 GE, 1 GD, 1 GS

[56] References Cited

U.S. PATENT DOCUMENTS

| 3,916,109 | 10/1975 | Gay ..................................... 179/1 GE |
| 4,140,878 | 2/1979 | Ohsawa ............................ 329/50 X |
| 4,167,650 | 9/1979 | Kusano ............................. 329/50 X |

Primary Examiner—Siegfried H. Grimm
Assistant Examiner—Edward P. Westin
Attorney, Agent, or Firm—Gerald J. Ferguson, Jr.; Joseph J. Baker

[57] ABSTRACT

The tendency for a sample-and-hold stereo multiplex demodulator having sampling pulses with low duty ratios to deemphasize the high frequency characteristics of the demodulated right and left signals is compensated for by connecting a pair of amplifiers to the right and left outputs and emphasizing the high-frequency characteristics thereof only during stereo reception.

2 Claims, 2 Drawing Figures

STEREO DEMODULATOR WITH HIGH FREQUENCY DE-EMPHASIS COMPENSATION

BACKGROUND OF THE INVENTION

1. Field of the Invention

This invention relates to an improvement in stereodemodulators. More specifically, it relates to stereodemodulators that obtain the left and right signals by sampling and holding the composite signal with sampling pulses having low duty ratios (abbreviated as sample-and-hold MPX demodulator hereafter).

2. Discussion of Prior Art

For improving the degree of separation in a stereodemodulator, a sample-and-hold MPX demodulator is known, which includes an oscillator which outputs a subcarrier having a frequency double that of the pilot signal in the composite signal, the subcarrier being phase-synchronized to the pilot signal. The prior art sample-and-hold MPX demodulator also includes circuitry for shaping the waveform of the oscillator output signal to obtain oppositely phased sampling pulses having low duty ratios and a sample-and-hold circuit which samples and holds the composite signal with the sampling pulses to obtain the left and right signals.

When stereodemodulation is performed by this prior art sample-and-hold MPX demodulator, separation is improved compared to a stereodemodulator that switches with oppositely phased subcarriers having duty ratios of 1:1. However, quantization distortion is greater in the high frequency range than in the low range during stereo reception due to the lower duty ratios of the sampling pulses. Thus, the prior art demodulator has a shortcoming in that the frequency characteristics in the high range are lowered. Further, since there is no such decrease in the high-frequency characteristics during monaural reception, an unnatural sensation is felt by a listener.

SUMMARY OF THE INVENTION

The object of this invention is to provide a stereodemodulator without the above shortcomings.

Other objects and advantages of this invention will be apparent from a reading of the following specification and claims taken with the drawing.

DETAILED DESCRIPTION OF PREFERRED EMBODIMENT OF THIS INVENTION

Figure 1:
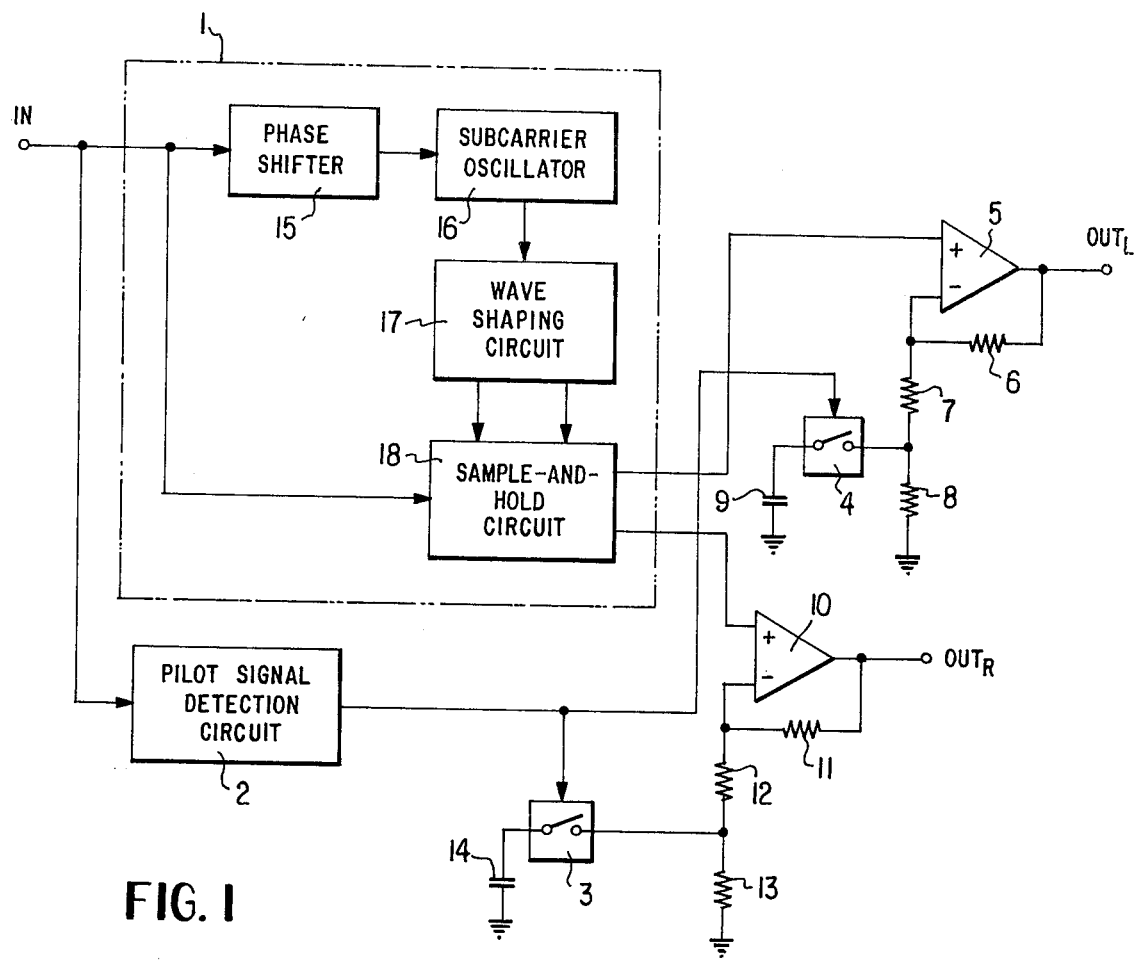
FIG. 1 is a block diagram of an illustrative embodiment of the invention.

Reference should be made to the drawing where like reference numerals refer to like parts.

FIG. 1 is a block diagram of an illustrative stereodemodulator in accordance with this invention. In FIG. 1, IN is the input terminal, 1 is a sample-and-hold MPX demodulator, 2 is a detection circuit that detects pilot signals (19 kHz) and drives switching elements 3 and 4. The left and right output signals of sample-and-hold MPX demodulator 1 are respectively applied to the non-inverting input terminals of amplifiers 5 and 10 for amplification. Amplifier 5 is also fed with a negative feedback voltage developed across resistors 7 and 8 of a feedback circuit that includes resistors 6, 7 and 8. A capacitor 9 is connected across resistor 8 via series switching element 4 when the switching element is on. Amplifier 10 is fed with a negative feedback voltage developed across resistors 12 and 13 of a feedback circuit that includes resistors 11, 12 and 13. A capacitor 14 is connected across resistor 13 via series switching element 3 when the switching element is on.

Figure 2:
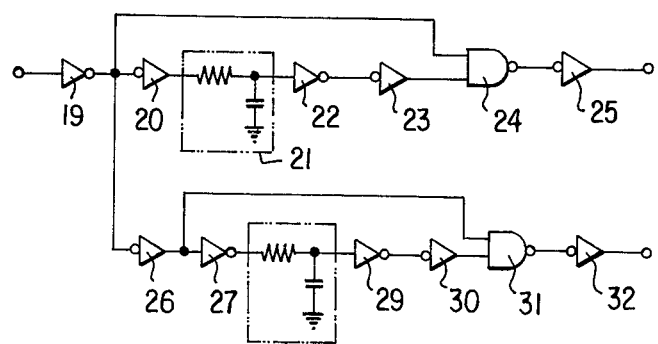
FIG. 2 is a block diagram of illustrative wave shaping circuit for use in FIG. 1.

Sample-and-hold MPX demodulator 1 may include a phase shifter 15, a phase-locked loop (PLL) subcarrier oscillator 16, a wave shaping circuit 17, and a sample-and-hold circuit 18. Wave shaping circuit 17 includes, for example, as shown in FIG. 2, inverters 19, 20, 22, 23, 25, 26, 27, 29, 30 and 32, NAND gates 24 and 31, and integrating circuits 21 and 28.

The operation of sample-and-hold MPX demodulator 1 is as follows. This circuit may have a configuration identical to a conventional stereodemodulator with a switching system with the exception of phase shifter 15 (optional) and wave shaping circuit 17. The phase shifter is for matching the peak point of the subcarrier and the center of the sampling pulse and the wave shaping circuit is for narrowing the width of the sampling pulse.

The subcarrier oscillator 16 is configured as a PLL circuit that outputs a square wave, the phase of which is synchronized to that of the pilot signal included in the composite signal. When the phase of the composite signal is shifted by slightly less than $\pi/4$ radian, the phase of the square wave subcarrier (38 kHz) is shifted by slightly less than $\pi/2$ radian. When the output of oscillator 16 is passed through wave shaping circuit 17, two sampling pulses with low duty ratios are obtained, the phase thereof being different by $\pi$ radian. The width of the sampling pulses can be adjusted by changing the time constants of integrating circuits 21 and 28.

On the other hand, during stereophonic signal reception, detection circuit 2 detects the presence of a pilot signal, and turns switching elements 3 and 4 on. Consequently, the capacitors 9 and 14 are connected in parallel to resistors 8 and 13 respectively so that the amount of negative feedback in amplifiers 5 and 10 changes to thereby intensify the high-frequency characteristics in accordance with the time constants determined by resistor 8 and capacitor 9, and resistor 13 and capacitor 14. Hence, lowering of the high-frequency characteristics (due to the sample-and-hold MPX demodulator) are compensated for. Consequently, the frequency characteristics can be made flat by properly selecting the amount of intensification.

When the pilot signal is not present - that is, during monaural signal reception, switching elements 3 and 4 are off so that capacitors 9 and 14 are removed from the feedback circuit of amplifiers 5 and 10. Accordingly, the frequency characteristics of amplifiers 5 and 10 become flat. Also, detection circuit 2 for the pilot signal may be a part of the PLL circuit so that the output of the high-low binary changes in dc level as determined by the presence and absence of the pilot signal also may be used.

As described above, the lowered high-frequency characteristics following demodulation can be compensated in a sample-and-hold MPX demodulator so that the frequency characteristics can be made flat during both stereophonic and monaural signal reception. Therefore, an unnatural feeling during listening is eliminated.

It is to be understood that the above detailed description of the various embodiments of the invention is provided by way of example only. Various details of design and construction may be modified without departing from the true spirit and scope of the invention as set forth in the appended claims.

What is claimed is:

1. In a stereodemodulator for demodulating a composite stereo signal including a sample-and-hold stereo multiplex demodulator having (a) an oscillator, the output of which is phase synchronous with and double in frequency that of a pilot signal in said composite stereo signal and (b) circuitry for deriving from the oscillator output signal, a pair of oppositely phased, low duty ratio sample pulses for sampling said composite stereo signal to obtain left and right signals therefrom, the improvement comprising pilot signal detecting means for detecting the presence of said pilot signal in said composite stereo signal; and a pair of frequency sensitive amplifiers respectively responsive to said left and right signals, said amplifiers including control means for varying the respective high-frequency characteristics thereof, said control means being responsive to said pilot signal detecting means to emphasize the high-frequency characteristics of said pair of amplifiers to thereby compensate for de-emphasis of the high frequency range of the right and left signals caused by said sample-and-hold stereo multiplex demodulator.

2. The improvement as in claim 1 where said pair of amplifiers each include frequency variable feedback means and where said control means varies the amount of feedback in said amplifiers.

* * * * *